United States Patent [19]
Bruning et al.

[11] Patent Number: 5,281,996
[45] Date of Patent: Jan. 25, 1994

[54] PHOTOLITHOGRAPHIC REDUCTION IMAGING OF EXTENDED FIELD

[75] Inventors: John H. Bruning, Pittsford; David R. Beaulieu, Fairport, both of N.Y.

[73] Assignee: General Signal Corporation, Stamford, Conn.

[21] Appl. No.: 940,537

[22] Filed: Sep. 4, 1992

[51] Int. Cl.$^5$ .................... G03B 27/42; G03B 27/32
[52] U.S. Cl. ........................................ 355/77; 355/53
[58] Field of Search ................................ 355/53, 77

[56] References Cited

U.S. PATENT DOCUMENTS

| | | | |
|---|---|---|---|
| 4,864,360 | 9/1989 | Isohata et al. | 355/53 |
| 4,869,998 | 9/1989 | Eccles et al. | 430/311 |
| 4,878,086 | 10/1989 | Isohata et al. | 355/77 |
| 4,924,257 | 5/1990 | Jain | 355/53 |
| 4,933,714 | 6/1990 | Buckley et al. | 355/43 |
| 5,160,957 | 11/1992 | Ina et al. | 355/43 |

OTHER PUBLICATIONS

"Optical Imaging for Microfabrication", by J. H. Bruning, J. Vac. Sci. Technol., 17(5), Sep./Oct. 1980, pp. 1147–1155.

"Stepand Scan: A Systems Overview of a New Lithography Tool", by J. D. Buckley and C. Karatzas, SPIE vol. 1088, Optical/Laser Micro lithography II (1989), pp. 424–433.

Primary Examiner—Richard A. Wintercorn
Attorney, Agent, or Firm—Eugene Stephens & Associates

[57] ABSTRACT

A mask or reticle for a single large microcircuit device is imaged in portions by an axially centered photolithographic reduction lens having a movable mask stage in addition to a movable wafer stage so that the portions of the complete device are imaged in juxtaposed registry on the wafer. This allows a single microcircuit device larger than the image field of the reduction lens to be imaged in a scanning mode or in a succession of steps forming images at the desired resolution range of 0.1–0.50 μm.

20 Claims, 5 Drawing Sheets

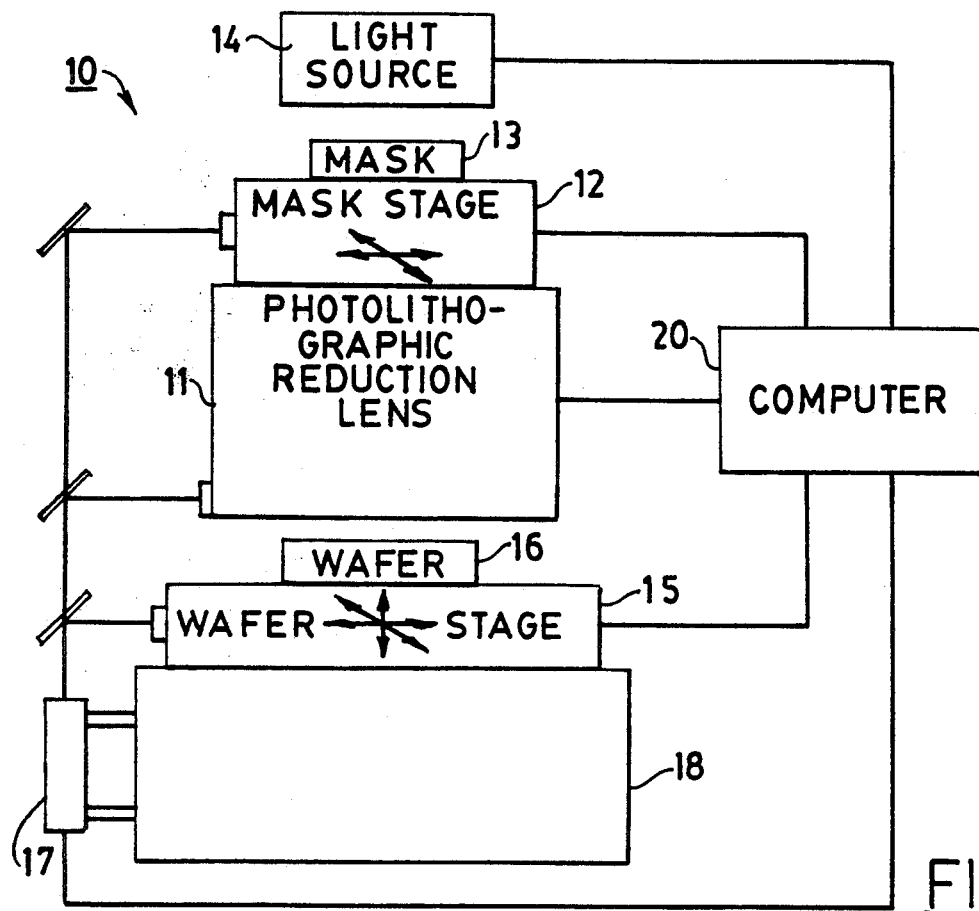
FIG.1
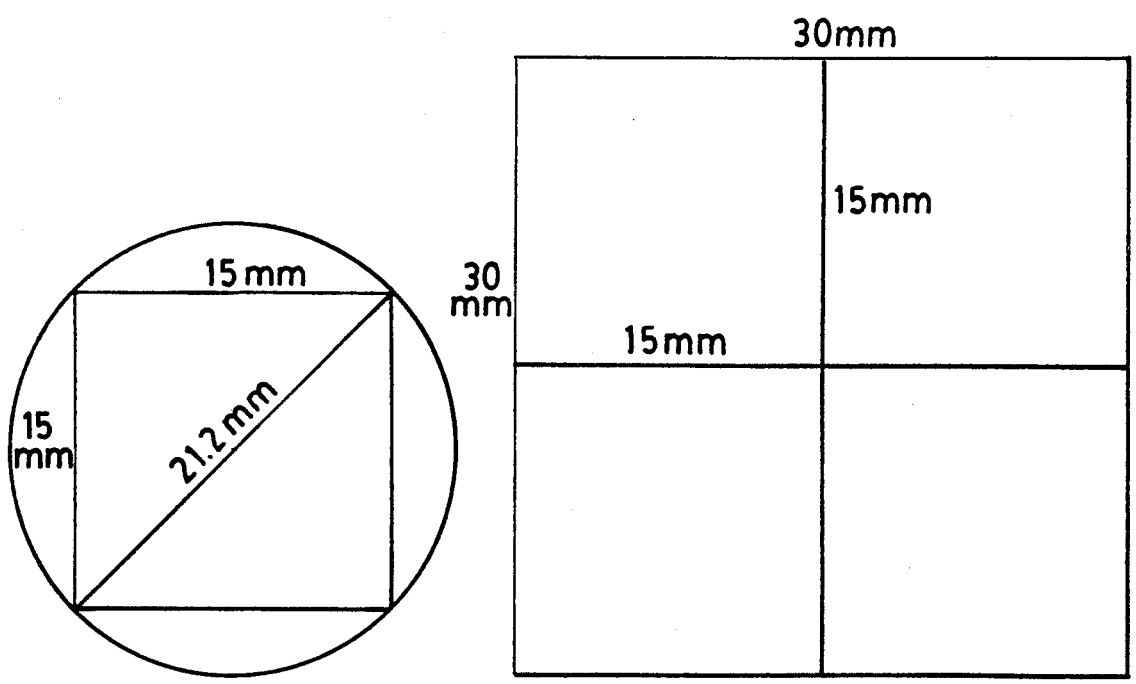
FIG.2
FIG.3

PHOTOLITHOGRAPHIC REDUCTION IMAGING OF EXTENDED FIELD

FIELD OF THE INVENTION

This invention involves photolithographic reduction imaging such as used in imaging microcircuit devices.

BACKGROUND

Equipment for forming photolithographic reduction images of microcircuit devices is under heavy pressure to improve or reduce the resolution dimension of elements in the imaged device while also imaging larger devices having bigger overall dimensions and containing ever-increasing numbers of finely resolved elements. The optical challenge of producing a microlithographic reduction lens that is free enough of aberration and distortion to meet the desired resolution range of 0.1–0.50 μm is already formidable; and to add the requirement that the microcircuit device become even larger compounds the difficulty of solving all the optical problems.

We have devised a solution that can use the best available photolithographic reduction lenses, without increasing the size of the axial image field of such lenses, to image microcircuit devices larger than will fit within a single image field. This allows well-understood and reliable lens systems, as they have evolved for present day "steppers," to be used in a different way that forms fine resolution images of microcircuit devices larger than such lenses can image in a single exposure. Our invention advances the capability of the best axially centered, photolithographic reduction lenses so that they can image microcircuit devices in extended fields that were not previously possible.

SUMMARY OF THE INVENTION

Our method of imaging a large microcircuit device achieves a resolution for elements in the device within a desired range of 0.1–0.50 micrometers (although this fine a resolution is not essential for practicing our invention). The imaged device can have a total size larger than the image field of an axially centered photolithographic reduction lens used in the imaging process, and a diagonal of the microcircuit device can exceed a diameter of the image field. To do this, we position a mask or reticle movably relative to the lens so that portions of the mask can be arranged movably within an axial viewing field of the lens. We also position a wafer movably within an axial image field of the lens and control the movements of the mask and the wafer. We then form reduced images of the mask on the wafer and correlate movements of the mask and wafer so that different regions of the mask are moved into the axial field of view of the lens and correspondingly different regions of the wafer are moved into the axial image field of the lens in a pattern that successively images the entire area of the microcircuit device.

This departs from previous operation of axially centered photolithographic reduction lenses, which have been used to image an entire microcircuit device in one exposure, which is then repeated for successive regions of a wafer, until many copies of the circuit have been imaged on a single wafer. A mask or reticle for the circuit being imaged is fixed in place for such a step and repeat operation.

Scanning of a mask or reticle of an entire microcircuit device has also been suggested, but lenses for scanning systems have had annular viewing and imaging fields, rather than axially centered ones. Such annular field lenses have not become accepted in the reduction photolithographic art, and reduction scanning with an annular field lens combines the unproven production performance of the lens with the difficulties involved in moving both a mask and a wafer at different rates. Our method, when practiced by scanning or imaging while stages for the mask and wafer are moving, faces a similar difficulty of different rates of movement for the mask and the wafer, but uses a lens with an axially centered viewing and imaging field, which has a proven record of production performance.

Imaging by our method can also be done in intervals between movement of the mask and wafer stages so that a mask portion of the microcircuit device is imaged on the wafer in juxtaposed registry with a previously imaged portion of the mask. The mask or reticle can have separated portions of the overall pattern for the microcircuit device, and images from portions that are separated at the mask can be joined in juxtaposed registry on the wafer. The axially centered viewing and imaging field of the reduction lens used in our method facilitates imaging of circuit portions having substantial length and breadth and joining of these imaged portions in juxtaposed registry at the wafer to form a complete microcircuit device. Annular field lenses, as proposed for scanning purposes, have image areas in the form of narrow curving arcs; and these are not geometrically suited for imaging juxtaposed and registered portions of microcircuit devices that are normally designed with rectangular length and breadth.

DRAWINGS

FIG. 1 is a schematic diagram of a preferred embodiment of microphotolithographic reduction equipment for extended field imaging according to our invention.

FIG. 2 is a diagram of an image field having dimensions that are typical of state-of-the-art, axially centered photolithographic reduction lenses.

FIG. 3 is a schematic view of an extended field image pattern formed of a plurality of image portions according to our invention.

DETAILED DESCRIPTION

A typical circular image field for a present day axially aligned, photolithographic reduction lens preferred for use in our invention is generally sized to make a square image of a predetermined size. The reduction of the lens and the size of the reticle or mask on which the image pattern is formed are also factors in the lens size and performance, as explained more fully below. In the example shown in FIG. 2, a lens having an image field diameter of 21.2 mm or larger can accommodate a square image 15 mm on a side in a single exposure of a microcircuit device, and available reduction lenses have established proven production performance at such image sizes. The most advanced of the present day axially aligned photolithographic reduction lenses can also meet the desired (but not required) resolution range of 0.1–0.50 μm for the individual elements within a microcircuit device.

Maintaining such a fine resolution and also substantially enlarging the size of an image formed on a wafer presents enormous difficulties. Our invention solves the larger image problem by using the best available lenses in a different way, as schematically shown in FIG. 3. There, 15 mm square images, which are achievable at very high resolution with the best available axially centered microlithographic reduction lenses, are formed in juxtaposed registry with each other to produce a single large microcircuit device 30 mm square. This requires imaging the mask or reticle for the microcircuit device in four portions and joining images of these portions accurately together at the wafer so that all the interconnections between the portions work properly. Of course, less than four image portions can be joined this way, and two or three image portions or even more than four image portions are also possible, as explained below.

Figure 4:
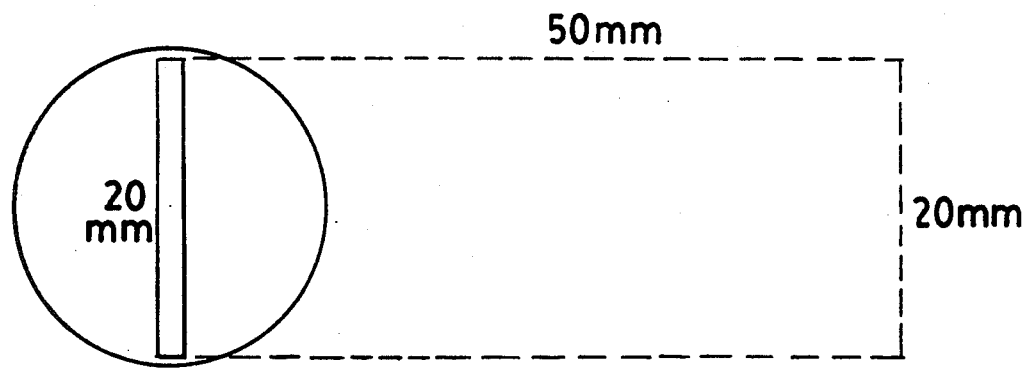
FIG. 4 is a schematic view of an extended field image pattern formable in a scanning version of our invention.

For a scanning version of our invention, as shown in FIG. 4, a narrow, 20 mm diametrical band of the available circular imaging field of FIG. 2 is selected by picking the most distortion-free diameter of an axially centered, photolithographic reduction lens. A light source suitable to a long narrow viewing band is then used, and the mask or reticle is moved relative to the lens so that the viewing band scans across the mask. At the same time, the wafer is moved at a lesser rate matching the reduction so that a 20 mm image band can sweep along a path of indefinite length to form a complete rectangular microcircuit device illustrated by the broken line in FIG. 4 as having a 50 mm length. The length can vary widely once the scanning process starts, but it is desirable that the width of the microcircuit device being imaged on the wafer be 20 mm or less so that a single sweep of the imaging band can complete a microcircuit device.

Table I partially explains the way image sizes and reticle sizes affect the lens field diameter.

TABLE I

| Single Reticle Size (inches) | Square Image Size at ¼X (mm) | Lens Field Diameter Required | | | | |
|---|---|---|---|---|---|---|
| | | 1 Part | 2 Part | 3 Part | 4 Part | Scan |
| 5 | 25 | 35.3 | 27.9 | 26.4 | 17.6 | 25 |
| 6 | 30 | 42.4 | 33.5 | 31.6 | 21.2 | 30 |
| 7 | 38 | 53.7 | 42.5 | 40.0 | 26.8 | 38 |

Table I assumes an axially centered photolithographic reduction lens that reduces the reticle pattern to an image one-fourth the size, and different numbers would result for a different reduction ratio. Table I also assumes a single mask or reticle, as conventionally made of glass, in a 5, 6, or 7 inch size. The lens field diameter numbers show the reductions in lens size that can be achieved by dividing the image into parts according to the invention. Each division of the image adds to the overall difficulty, but has the benefit of requiring a smaller lens field diameter for the large extended field that is desired. The numbers assume square overall image sizes, but parts of the image need not be square.

Figure 6:
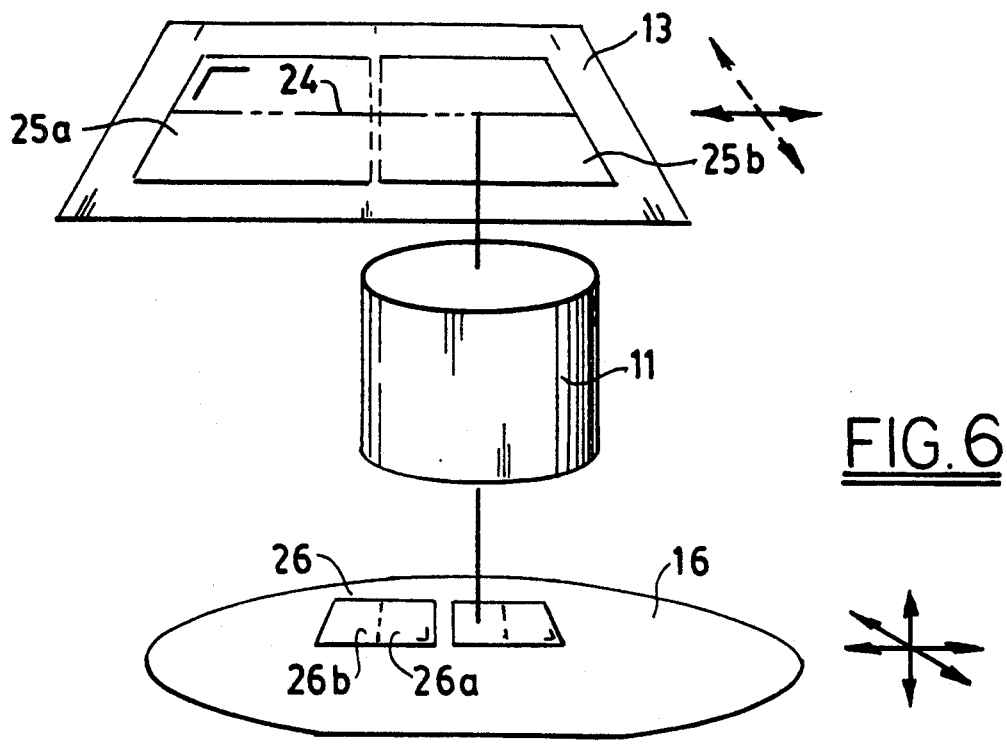
FIG. 6 is a schematic perspective view similar to the view of FIG. 5, but showing portions of the microcircuit device separated at the mask and joined in juxtaposed registry at the wafer.
Figure 9:
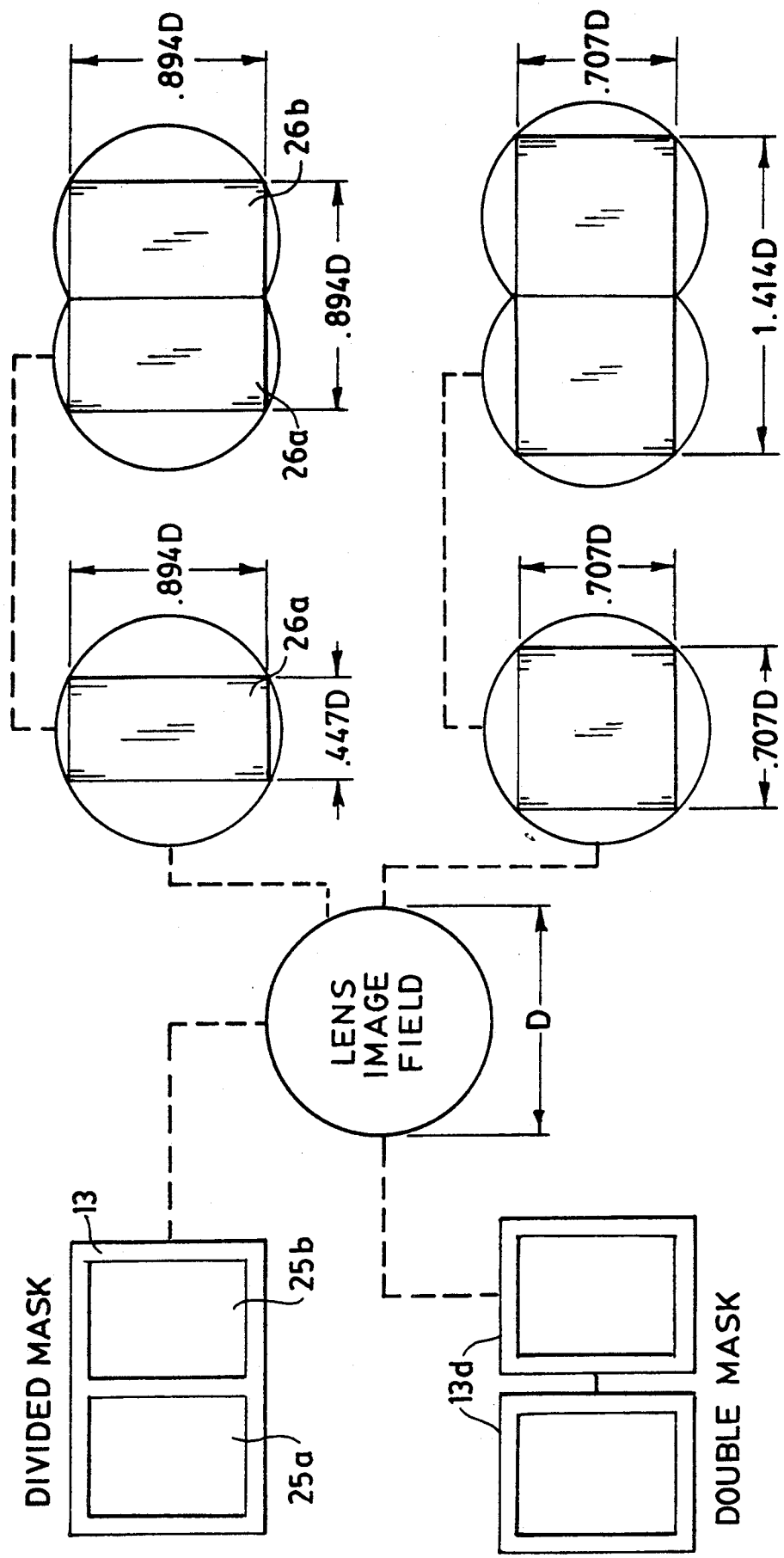
FIG. 9 is a schematic diagram showing how a single divided mask and a double mask can be imaged successively in juxtaposed registry to produce extended field images.

Using rectangular overall image sizes can also affect lens field diameter numbers favorably. Another alternative that can help reduce lens field diameter requirements is to use more than one reticle glass mounted on a stage or shuttle that moves the separate reticles into the viewing field of the lens. A single pattern for a microcircuit device can be divided between two or more separate reticles that are imaged in juxtaposed registry on a wafer, and this expedient can further reduce the lens field diameter requirements. To clarify this, FIG. 9 schematically shows a single mask or reticle 13, divided into rectangular portions 25 that are imaged in successive steps to form a square microcircuit device, compared with a double mask pair of reticles 13d successively imaged by the same lens to form a rectangular image of a microcircuit device. The imaging of divided mask 13, as schematically shown in FIG. 9, is also illustrated in FIG. 6, with FIG. 9 adding information about the relationship of the image to the lens field diameter. The imaging of double mask 13d, also illustrated in FIG. 9, produces two square image portions joined in an extended rectangular image having the indicated relationships to the image field diameter.

Table II shows the extended field sizes available from these imaging alternatives for a succession of different field diameter lenses.

TABLE II

| Lens Field Diameter mm | Largest Single-Field Inscribed Square | | Largest 2-Part Square | | Largest 2-Part Rectangle | |
|---|---|---|---|---|---|---|
| | mm × mm | mm² | mm × mm | mm² | mm × mm | mm² |
| 14.1 | 10.0 | 100.0 | 12.6 | 160.0 | 10 × 20 | 200.0 |
| 17.7 | 12.5 | 156.3 | 15.8 | 250.0 | 12.5 × 25 | 312.5 |
| 21.2 | 15.0 | 225.0 | 19.0 | 360.0 | 15 × 15 | 450.0 |
| 24.7 | 17.5 | 306.3 | 22.1 | 490.0 | 17.5 × 35 | 612.5 |
| 28.3 | 20.0 | 400.0 | 25.3 | 640.0 | 20 × 40 | 800.0 |
| 31.1 | 22.0 | 484.0 | 27.8 | 774.4 | 22 × 44 | 968.0 |
| 35.4 | 25.0 | 625.0 | 31.6 | 1000.0 | 25 × 50 | 1250.0 |

Table II assumes a ¼ reduction and five inch reticles except for the bottom two numbers in the 2-Part Square columns, which require six inch reticles. The Largest Single-Field Inscribed Square columns show the square and area dimensions for single images formed in a conventional step and repeat mode with lenses having the field diameter sizes shown in the left column. The right-side columns show the extended field enlargement that is possible with our invention—the Largest 2-Part Square columns using a single reticle divided into two rectangular mask portions, as indicated in the upper half of FIG. 9, and the Largest 2-Part Rectangle columns using double reticles whose images are joined in an extended rectangular field, as indicated in the lower half of FIG. 9. The numbers show that the extended field according to the invention can be made substantially larger than what is now possible with existing photolithographic reduction lenses.

One advantage of our invention is that much of the equipment for practicing it is generally available, is well understood, and has a proven performance record. This especially applies to the axially centered, photolithographic reduction lens 11 shown schematically in the lithographic system of FIG. 1. A mask or reticle stage 12 is used so that the mask 13 can be moved relative to the light source 14 and the lens 11. Mask stage movement is schematically represented for both X and Y directions; but for some imaging arrangements, a single direction of movement for mask 13 can be adequate. If more than one reticle is used, stage 12 can operate as a shuttle device moving between positions that register each mask with the object field of view of lens 11.

A movable stage 15 is also used for moving wafer 16 in the image field of lens 11, and wafer stages capable of the necessary movements are already available. Wafer stage 15 preferably has both X, Y, and Z movement capability, as schematically represented and as currently available in the reduction photolithography art. The X and Y movements are necessary for positioning images properly on the surface of wafer 16, and the Z movement capability is necessary for keeping the image bearing surface of wafer 16 at a focal distance from lens 11. Since the focal surface of wafer 16 can vary between image regions, Z movement of stage 15 can ensure that different portions of the overall image are conformed with a best average focal surface. The movements of mask 13 and wafer 16 that are necessary for practicing our invention differ from what has previously been done with axially aligned photolithographic reduction lenses, and some effort is required to make the new movements available.

An interferometer 17 or other metrology device is preferably arranged on a base 18 for monitoring movement of wafer stage 15 and mask stage 12 relative to lens 11. This is done under control of computer 20, which also makes any necessary adjustments in lens 11 and light source 14.

Figure 5:
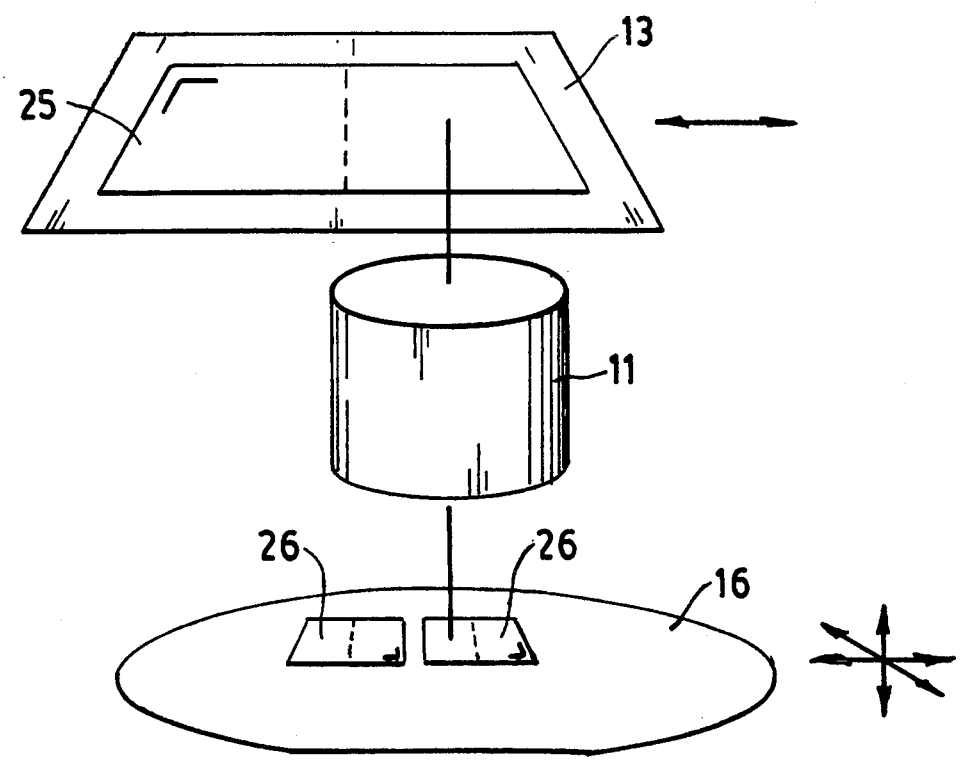
FIG. 5 is a schematic perspective diagram illustrating a way of imaging movable portions of a mask in juxtaposed registry forming extended field images of a microcircuit device on a wafer, according to our invention.

The imaging of a single microcircuit device in portions is schematically illustrated in FIG. 5. Mask or reticle 13 provides a pattern 25 for a single microcircuit device that is imaged in two portions divided by a broken line. These portions are joined in juxtaposed registry on wafer 16 where images of several microcircuit devices are formed in two parts, as illustrated.

Since the image field of axially aligned lens 11 is circular, masking is required to eliminate overlap that would otherwise occur along the broken line. To avoid the problems this entails, the portions of the mask pattern 25 can be separated along the double broken line to form mask circuit portions 25a and 25b, as shown in FIG. 6 and in the upper half of FIG. 9. These separate portions, when imaged on wafer 16, are joined in juxtaposed registry along the broken lines of a completely imaged microcircuit device 26, as illustrated The joining of image portions 26a and 26b along the broken line connects all the elements of microcircuit device 26 that extend across the broken line, to form one complete and intact image of the circuitry of device 26. The configuration of circuit elements extending across the image boundary can be designed to facilitate such image joining. Copies of the complete images 26 can then be repeated in different regions of wafer 16 as illustrated in FIG. 6.

The mask circuit can also be divided into more than two portions, as shown by the single broken line in FIG. 6. This can divide the mask into four portions that are separately imaged in juxtaposed registry to form an even larger microcircuit device 26. FIG. 3 shows an example of such a four-part device, and Table I adds some information on four-part image sizes relative to lens field diameters. Mask stage 12 is movable in both X and Y directions for four-part imaging, as suggested by the broken line arrow in FIG. 6.

Figure 7:
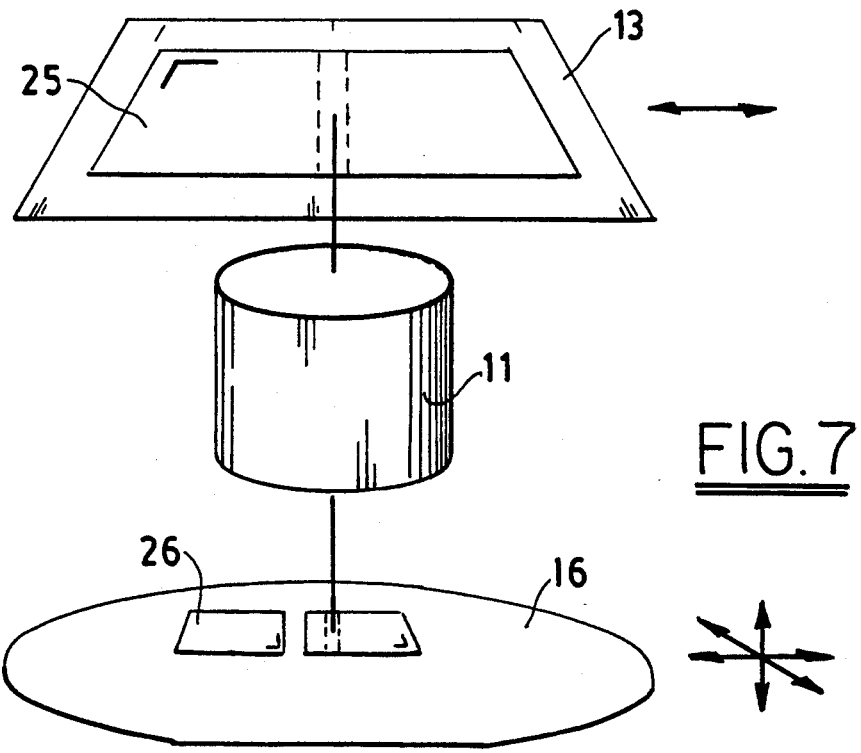
FIG. 7 is a schematic perspective view of a scanning form of our extended field imaging.

The scanning form of our invention is illustrated in FIG. 7 where a narrow broken line band, corresponding to the 20 mm band shown in FIG. 4 and described above, is swept across the mask pattern 25 by moving the mask or reticle 13. At the same time, wafer 16 is moved at a lesser rate, matching the reduction of axially centered lens 11 so that the broken line scanning band forms a reduced image 26 on wafer 16. This can be repeated as illustrated to form a number of complete images of microcircuit devices 26 on a single wafer 16. The longer arrow adjacent mask 13 represents its larger movement, relative to the movement of wafer 16.

Figure 8:
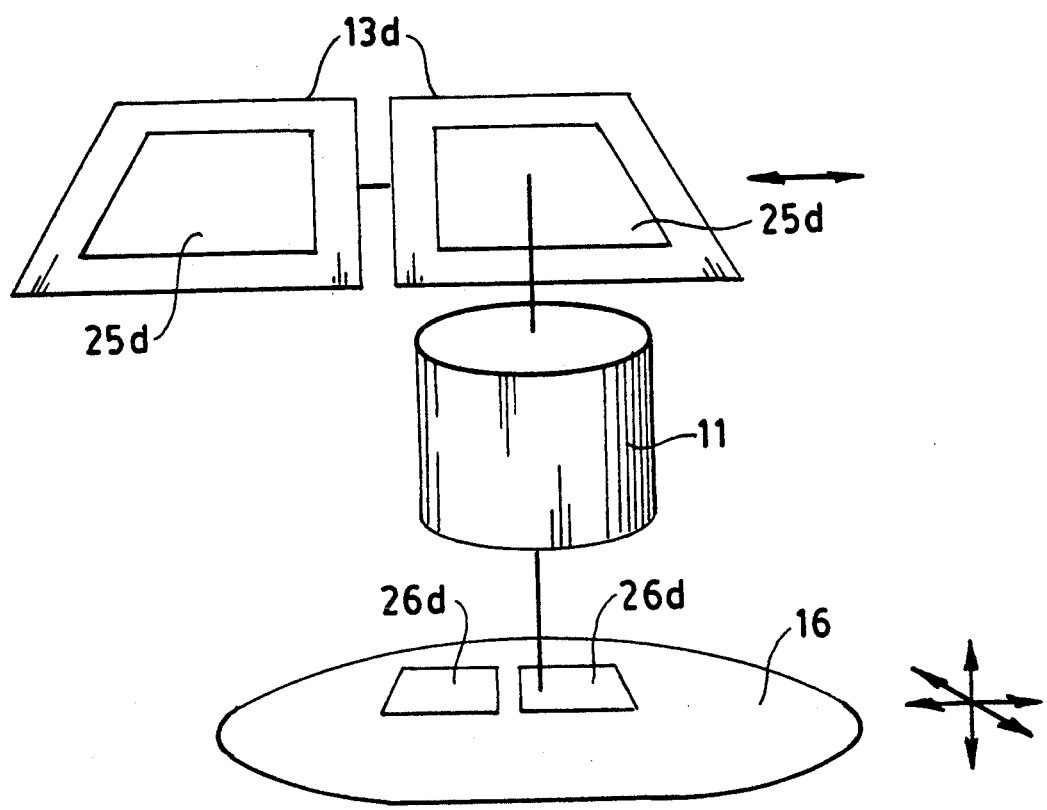
FIG. 8 is a schematic perspective view similar to FIGS. 5–7, but showing extended field imaging using a double mask.

Extended field imaging using a double mask 13d is schematically illustrated in FIG. 8 and in the bottom half of FIG. 9. Relatively large and square imaging patterns 25d, on double reticles or masks 13d, are shuttled reciprocally into the viewing field of lens 11; and mask 15 is moved in the image field of lens 11 so that extended field rectangular images 26d are formed on successive regions of wafer 16. Each of the images 26d is formed by juxtaposing and registering a pair of images 25d carried on double masks 13d.

The imaging shown in FIGS. 5, 6, and 8 occurs between movements of mask 13 and wafer 16, while these are both stationary. This is presently easier to achieve accurately than the scanning method shown in FIG. 7, where imaging occurs during simultaneous movements of mask 13 and wafer 16. The image portioning arrangements shown in FIGS. 5, 6, and 8 are also especially suitable for use with an axially centered photolithographic reduction lens, which has a circular image field covering a substantial area that can be used for each image portion. This is borne out by FIG. 9 and by the tables explained above.

Extended field image portioning according to our invention also facilitates quality control inspection of the resulting microcircuit devices. The quality of the imaging of a microcircuit device can be checked in several areas, as is presently customary; and if the image quality is satisfactory in every region checked, the imaging can be assumed to meet quality standards throughout the image area of the entire microcircuit. This means that the quality of images 26, and their image parts 26a and b, can be checked by determining the quality of each image portion 26a and b and the quality of the boundary line between them. If the juxtaposed registry line between the image portions is accurately formed, and each image portion itself meets quality standards, then the quality of the entire microcircuit device is reasonably assured. A scanned image could experience errors anywhere along the scan direction so that a different and more comprehensive quality control inspection is required for scanned images.

We claim:

1. A method of imaging a large microcircuit device in a resolution range of 0.1-0.50 micrometers, said method comprising:
   a. using an axially centered photolithographic reduction lens having a circular image field with a diameter that is less than a diagonal of said microcircuit device;
   b. arranging a stage for a mask for said microcircuit device to be movable relative to said lens;

c. arranging a stage for a wafer on which said microcircuit device is imaged to be movable relative to said lens;
d. controlling the accuracy of movement of said stages relative to said lens; and
e. using said movement of said stages to correlate different regions of said mask moved into a field of view of said lens with correspondingly different regions of said wafer moved into said image field of said lens in a pattern that successively images the entire area of said microcircuit device.

2. The method of claim 1 including adjusting a focal distance between said lens and said different regions of said wafer.

3. The method of claim 1 wherein said imaging of said microcircuit device occurs during said movements of said mask and wafer stages, and a diametrically extending region of said circular image field is used for said imaging.

4. The method of claim 1 wherein said movement of said stages is stopped while a portion of said microcircuit device is imaged, and successively imaged portions of said microcircuit device are registered along boundaries of said imaged portions on said wafer.

5. The method of claim 4 including determining image quality of said microcircuit device by inspecting predetermined areas of said device, including an area along said boundaries.

6. The method of claim 4 including separating said different regions of said mask at said field of view and joining said correspondingly different regions of said wafer at said image field.

7. The method of claim 4 including using a plurality of said masks for said microcircuit device and moving said masks successively into said field of view of said lens.

8. A method of imaging a microcircuit device having a total size larger than the image field of an axially centered photolithographic reduction lens used for imaging said microcircuit device, said method comprising:
a. separately imaging each of a plurality of portions of a mask for said microcircuit device by moving said mask relative to a viewing field of said lens and moving a wafer into a corresponding succession of positions in said image field of said lens; and
b. controlling said lens and the movements of said mask and said wafer so that separately projected and reduced images of said mask portions are formed in registered juxtaposition on said wafer.

9. The method of claim 8 including dividing and separating said portions of said mask at said field of view and interconnecting in said registered juxtaposition corresponding image portions formed on said wafer.

10. The method of claim 8 including using separate reticles for said portions of said mask.

11. The method of claim 8 including varying the focus of said images formed on different areas of said wafer.

12. The method of claim 8 including determining the quality of the imaging of said microcircuit device on said wafer by inspecting a predetermined region of said microcircuit device along said registered juxtaposition.

13. A method of imaging a large microcircuit device with an axially centered photolithographic reduction lens having an image field smaller than said device, said method comprising:
a. positioning a mask for said device movably within the object side field of view of said lens;
b. positioning a wafer movably within an axial image field of said lens so that a reduction of said mask can be imaged on said wafer; and
c. imaging a portion of said mask on a region of said wafer and moving said mask and said wafer to change the portion of said mask being imaged and the region of said wafer on which images are formed in juxtaposed registry with each other until all of said mask is imaged on said wafer.

14. The method of claim 13 including dividing said mask into portions and separately imaging said mask portions onto said wafer in said juxtaposed registry.

15. The method of claim 14 including separating said mask portions at said field of view of said lens and joining on said wafer the juxtaposed images of said portions.

16. The method of claim 14 including using separate reticles for said portions of said mask.

17. The method of claim 14 including stopping the imaging during movement of said mask and said wafer.

18. The method of claim 13 including forming the images on said wafer during movement of said mask and said wafer.

19. The method of claim 13 including controlling said lens and the movements of said wafer and said mask relative to said lens so that a resolution range of images formed on said wafer is 0.1–0.50 micrometers.

20. The method of claim 13 including varying a focal distance between said lens and said wafer for different image regions of said wafer.

* * * * *